US008884407B2

(12) United States Patent
Sternad et al.

(10) Patent No.: US 8,884,407 B2
(45) Date of Patent: Nov. 11, 2014

(54) DEVICES FOR PROVIDING AN ELECTRICAL CONNECTION

(71) Applicant: Infineon Technologies AG, Neubiberg (DE)

(72) Inventors: Michael Sternad, Klagenfurt (AT); Rainer Pelzer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/693,481

(22) Filed: Dec. 4, 2012

(65) Prior Publication Data

US 2014/0151905 A1    Jun. 5, 2014

(51) Int. Cl.
| H01L 23/552 | (2006.01) |
| H01R 43/02 | (2006.01) |
| G02B 19/00 | (2006.01) |
| H01L 23/498 | (2006.01) |

(52) U.S. Cl.
CPC ............ H01R 43/02 (2013.01); G02B 19/0028 (2013.01); G02B 19/0047 (2013.01); H01L 23/49811 (2013.01)
USPC .................. 257/659; 257/749; 257/E21.006; 257/E21.077; 257/E21.129; 257/E21.134; 257/E21.267; 257/E21.269; 257/E21.274; 257/E21.311; 257/E21.324; 257/E21.329; 257/E21.347; 257/E21.475; 257/E21.509; 257/E21.517

(58) Field of Classification Search
USPC ......... 257/659, 428, 749, 209, 431, 432, 660, 257/678, 728, 721, 734, E21.006, E21.077, 257/E21.129, E21.134, E21.267, E21.269, 257/E21.274, E21.311, E21.324, E21.329, 257/E21.347, E21.475, E21.509, E21.517
See application file for complete search history.

(56) References Cited

U.S. PATENT DOCUMENTS

| 5,842,628 | A | 12/1998 | Nomoto et al. |
| 6,390,853 | B2 | 5/2002 | Evers |
| 6,445,060 | B1 * | 9/2002 | Courtenay et al. ............ 257/666 |
| 6,562,693 | B2 | 5/2003 | Ichikawa et al. |
| 6,835,898 | B2 * | 12/2004 | Eldridge et al. .............. 174/267 |
| 7,259,353 | B2 | 8/2007 | Guo |
| 8,505,414 | B2 * | 8/2013 | Culf ............................ 76/101.1 |
| 2002/0063144 | A1 | 5/2002 | Yamaguchi et al. |
| 2006/0049153 | A1 | 3/2006 | Cahoon et al. |
| 2006/0219672 | A1 | 10/2006 | Ruben et al. |
| 2011/0024402 | A1 | 2/2011 | Hozumi et al. |

FOREIGN PATENT DOCUMENTS

CA          2010503 A1     8/1990

* cited by examiner

*Primary Examiner* — David Nhu
(74) *Attorney, Agent, or Firm* — Slater & Matsil, L.L.P.

(57) ABSTRACT

A device includes a tube extending in a longitudinal direction and a hollow channel arranged in the tube. An end part of the tube is formed such that first electromagnetic radiation paths extending in the tube and outside of the hollow channel in the longitudinal direction are focused in a first focus.

18 Claims, 10 Drawing Sheets

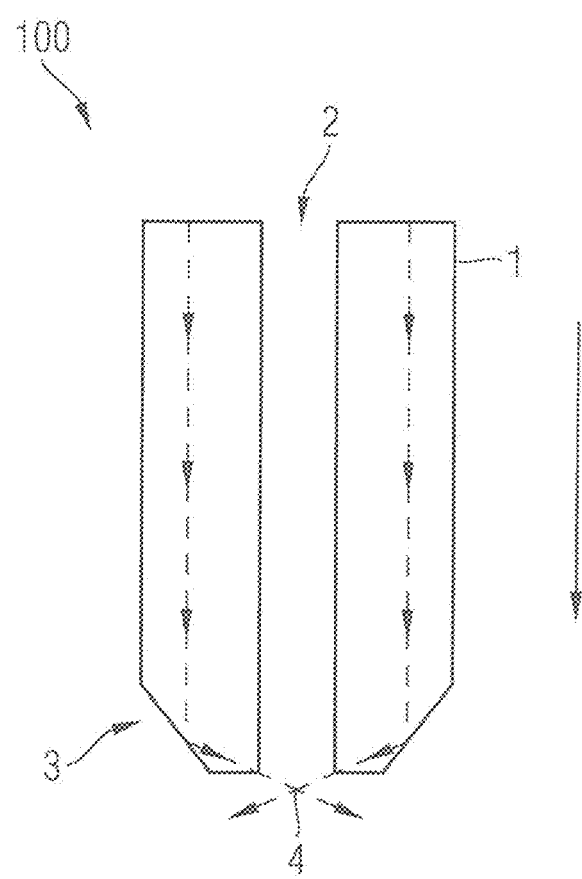

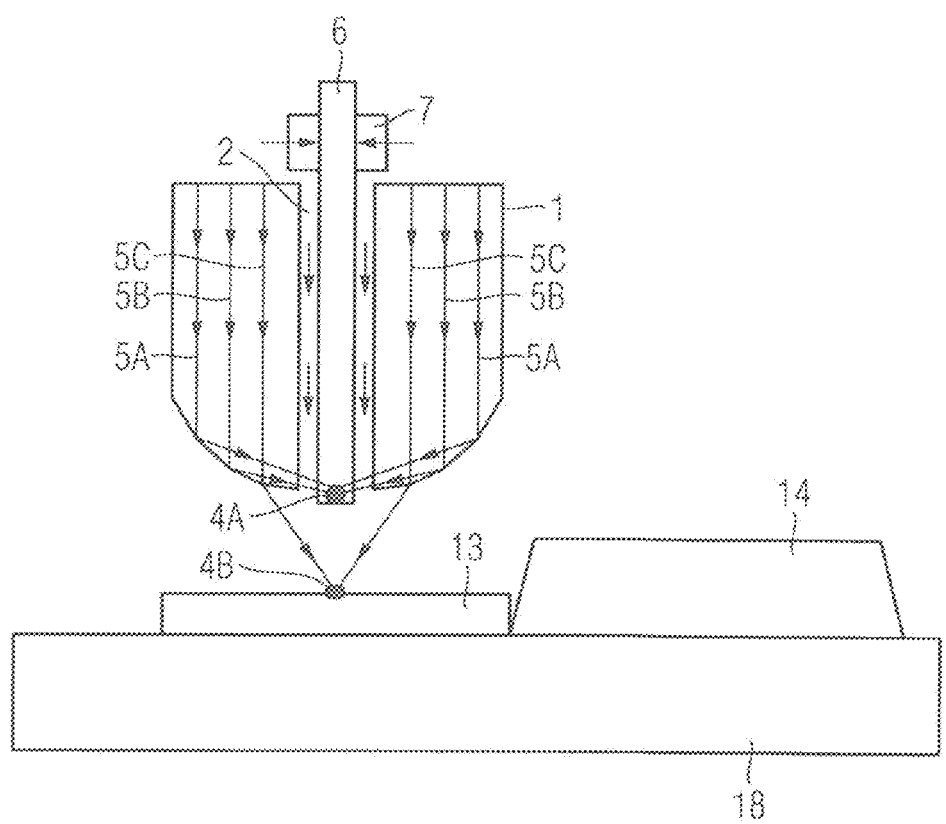

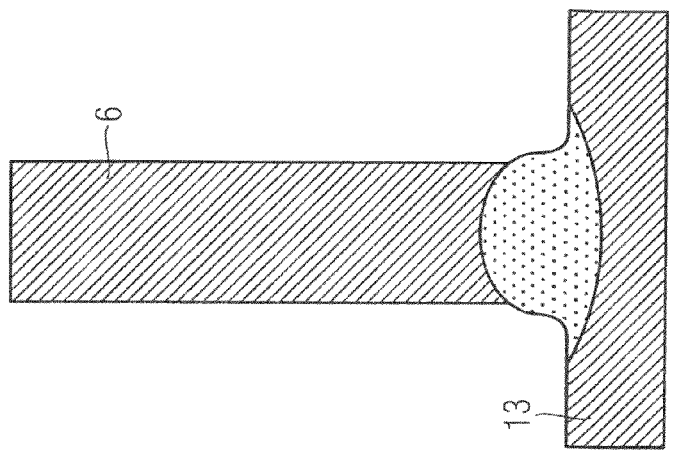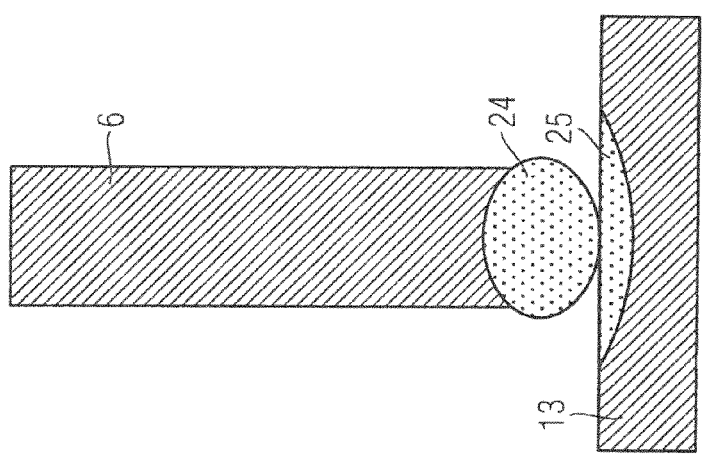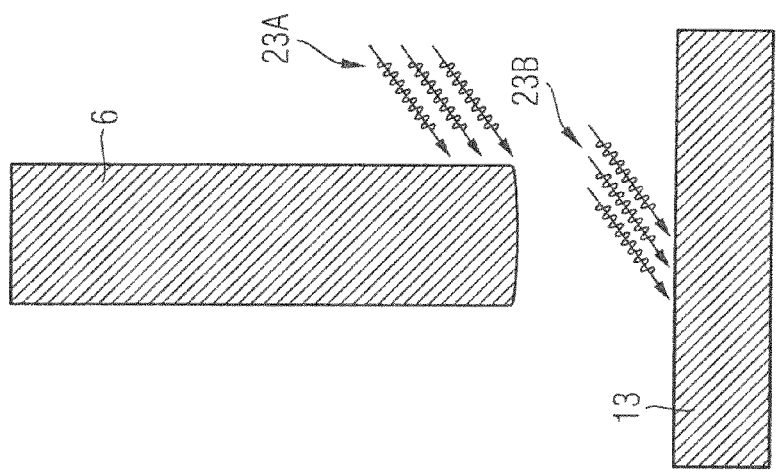

DEVICES FOR PROVIDING AN ELECTRICAL CONNECTION

TECHNICAL FIELD

This invention relates to devices and methods for providing an electrical connection. The invention further relates to devices including such electrical connection.

BACKGROUND

Microelectronic devices may require electrical interconnections. To avoid any interface or adhesion weakness of such interconnections fabrication processes may be used that may cause mechanical stress in the microelectronic device. Devices and methods for providing reliable electrical connections constantly have to be improved. In particular, it may be desirable to avoid damage through mechanical stress and further to improve the quality of the electrical connections.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

FIG. 1 schematically illustrates a cross-sectional view of a device 100 in accordance with the disclosure;

FIGS. 4A to 4G schematically illustrate a cross-sectional view of a method for operating a device 400 in accordance with the disclosure;

FIGS. 7A to 7C schematically illustrate a cross-sectional view of a method for providing an electrical connection in accordance with the disclosure.

DETAILED DESCRIPTION OF ILLUSTRATIVE EMBODIMENTS

Figure 2A:
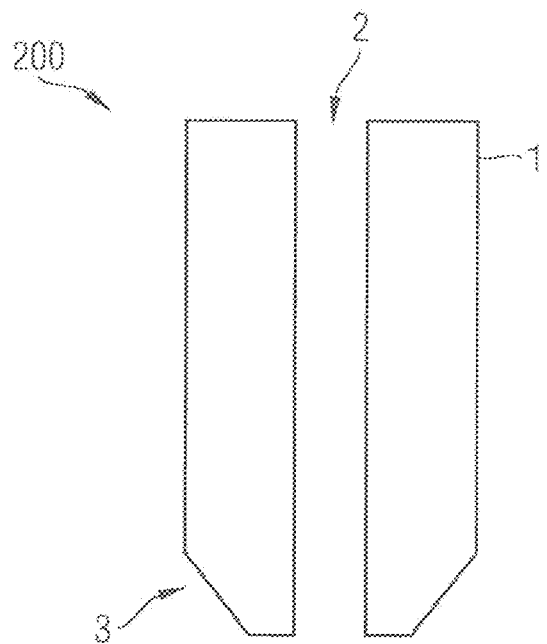
FIGS. 2A and 2B schematically illustrate a cross-sectional view of a method for operating a device 200 in accordance with the disclosure.

In the following detailed description, reference is made to the accompanying drawings in which are shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is to be understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that the features of the various exemplary aspects described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

The devices described herein may include a tube having one or more electromagnetic radiation paths along which electromagnetic radiation may propagate through the tube. In the following, the terms "tube," "capillary" and "capillary tube" may be used interchangeably. A direction into which the tube extends or a direction of the tube's maximum extension may be referred to as longitudinal direction. It is noted that the tubes described herein are not necessarily restricted to have a specific geometric form. For example, a cross section of the tube perpendicular to the longitudinal direction may be of arbitrary shape. The tube may, e.g., have the form of a cylinder such that a cross section of the tube perpendicular to the longitudinal direction may have a circular form. In a further example, a cross section of the tube perpendicular to the longitudinal direction may have a square form or an elliptic form. An end part of the tube may be formed such that electromagnetic radiation paths extending in the tube may follow specific directions that are described more detailed below.

The term "electromagnetic radiation path" may refer to a path along which electromagnetic radiation may propagate. For the exemplary case of the electromagnetic radiation being visible to the human eye, i.e., having a wavelength lying in a range of about 380 nanometers to about 740 nanometers, an "electromagnetic radiation path" may be referred to as "optical path." The devices and methods described herein may be based on electromagnetic radiation of various and arbitrary wave lengths, in particular infrared electromagnetic radiation, ultraviolet electromagnetic radiation, and electromagnetic radiation visible to the human eye. An electromagnetic radiation path may be represented by a line arranged perpendicular to wave fronts of the electromagnetic radiation waves propagating along the electromagnetic radiation path. An electromagnetic radiation path of a tube may thus refer to a course along which electromagnetic radiation provided by an electromagnetic radiation source may take in traversing the tube. It is noted that the term "electromagnetic radiation path" may particularly refer to an inherent property of the tube which is independent on the fact whether electromagnetic radiation actually travels the electromagnetic radiation path or not.

The tubes described herein may be manufactured of various materials and material combinations that may depend on an actual wavelength of used electromagnetic radiation. For example, a tube used in connection with an infrared (IR) laser source may be made of or may include at least one of a quartz material, ZnS, GaAs and sapphire. The tube material may particularly be chosen such that laser light propagating along electromagnetic radiation paths in the tube may be reflected or refracted at an inner wall of the tube. For this purpose, the tube may also include additional layers that may be deposited on an outer and/or inner wall of the tube and may be configured to provide an appropriate reflection or refraction of the laser light. For example, a deposited layer may be made of or may include one or more reflective coatings. The tube may be manufactured by an arbitrary technique. In particular, an end part of the tube may be shaped and formed by using techniques used for manufacturing precision optics devices like lenses, prisms, etc.

The tube may include a hollow channel. The hollow channel may have a thickness from about 15 μm (micrometers) to about 1000 μm (micrometers), depending on a thickness or diameter of a wire that may be inserted into the hollow channel, and more particular from about 20 μm (micrometers) to about 100 μm (micrometers). The hollow channel may have a substantially circular cross section such that the term "thickness" of the hollow channel may refer to the diameter of the hollow channel. It is understood that the hollow channel may also have a cross section of different form. In particular, the hollow channel may be formed such that a wire may be inserted into the hollow channel and fed through completely.

The devices and methods described herein may be based on a focus referring to a convergence point of an electromagnetic wave or electromagnetic radiation. It is noted that such focus does not necessarily relate to a singular point, but rather may relate to an extended area in which the electromagnetic radiation is bundled. The term focus may also specify an area in which the energy density of the electromagnetic radiation is increased due to its focusing compared to the energy density of the unfocused electromagnetic radiation.

The devices and methods described herein may include a source of laser light as an example of an electromagnetic radiation source. For example, such source may comprise at least one of a solid-state laser and a gas laser. The source may emit laser radiation having a wave length in a range from about 100 nm to about 10 μm (micrometers). In particular, the wavelength of the laser radiation may depend on the employed laser type. The devices described herein may further include an interface configured to couple a tube to the laser source. For example, an interface may be or may include at least one of an optical fiber, an optical waveguide, and a fiber-optic cable.

The devices and methods described herein may include a semiconductor material and/or further material used in the fabrication of microelectronic devices, for example in form of a semiconductor chip, a leadframe, a printed circuit board, etc. Semiconductor chips as described herein may be of arbitrary type and may be designed as logic integrated circuits, analog integrated circuits, mixed signal integrated circuits, power integrated circuits, memory circuits, optical or electromechanical devices, or integrated passives. The semiconductor chips need not be manufactured from specific semiconductor material, for example, Si, SiC, SiGe, GaAs, and, furthermore, may contain inorganic and/or organic materials that are not semiconductors, such as, for example, dielectrics, organic polymers or metals. Moreover, the included semiconductor chips may be packaged or unpackaged wherein the devices and methods described herein do not necessarily depend on an employed packaging technique.

The devices and methods described herein may utilize a pure inert gas or forming gas and a unit configured to provide the forming gas. A forming gas may be a mixture of hydrogen and an inert gas. For example, a forming gas may be a mixture of hydrogen and nitrogen wherein the portion of the hydrogen may lie in a range from about 3 percent to about 15 percent. The forming gas may be used as an atmosphere for processes requiring reductive properties of hydrogen gas. In particular, the forming gas may be used for avoiding oxidation processes or to clean present metal surfaces.

The devices and methods described herein may utilize a wire, in particular a bond wire or a bonding wire. In the following, the terms "wire," "bond wire" and "bonding wire" may be used interchangeably. The bond wire may include a metal or a metal alloy, in particular gold, aluminum, copper or one or more of their alloys. In addition, the bond wire may or may not include a coating. The bond wire may have a thickness from about 15 μm (micrometers) to about 1000 μm (micrometers), more particular a thickness of about 25 μm (micrometers) to about 50 μm (micrometers). The bond wire may have a substantially circular cross section such that term "thickness" of the bond wire may refer to the diameter of the bond wire. It is understood that the bond wire may also have a cross section of different and arbitrary form.

The devices described herein may include a first electrical contact element, for example an electrical contact pad. The first electrical contact element may be arranged over or on an electrical device or semiconductor chip and may be electrically coupled to an integrated circuit or an electronic structure included in the electrical device or semiconductor chip. The first electrical contact element may be manufactured in one piece or may include one or more metal layers applied to, e.g., a semiconductor or dielectric material of a semiconductor chip. The metal layers may be manufactured with any desired geometric shape and any desired material composition or thickness. Any desired metal or metal alloy, for example, aluminum, copper, titanium, gold, silver, palladium, platinum, nickel, chromium, vanadium, tungsten or molybdenum, may be used as a material. In particular, the first electrical contact element may be made of or may include one of a copper and a copper alloy. The metal layers need not be homogeneous or manufactured from just one material, i.e., various compositions and concentrations of the materials included in the metal layers may be possible. The first electrical contact element may have a polycrystalline structure.

The devices described herein may include a second electrical contact element. For example, the second electrical contact element may be or may include an electrical contact element of a second semiconductor chip, a Printed Circuit Board (PCB) or a pin of a leadframe to which a semiconductor chip shall be coupled. The second external electrical contact element may be made of or may include any desired electrically conductive material, for example any desired metal, such as aluminum, nickel, palladium, titanium, tungsten, silver, tin, gold, molybdenum, vanadium or copper, a metal alloy or an electrically conductive organic material.

The devices described herein may include a solidification structure which may represent a continuous transition between a first material and a second material. A solidification structure may be formed when the temperature of a melted metal or a melted metal alloy falls below its solidification temperature and a polycrystalline structure may begin to form. The start of forming a crystal may be referred to as nucleation and a point at which a nucleation occurs may be referred to as a nucleation point. When the temperature falls below the solidification temperature, atoms of a melted metal or a melted metal alloy may begin to bond together at the nucleation points and start to form crystals. As a result, a solidification structure may at least partly be of polycrystalline type.

FIG. 1 schematically illustrates a cross-sectional view of an exemplary device 100 in accordance with the disclosure. The device 100 includes a tube 1 extending in a longitudinal direction (see right arrow). The device 100 further includes a hollow channel 2 arranged in the tube 1. In FIG. 1, the hollow channel 2 is arranged in the longitudinal direction. It is noted that in other examples the hollow channel 2 may have a different spatial orientation. An end part 3 of the tube 1 is formed such that first electromagnetic radiation paths extending in the tube 1 and outside of the hollow channel 2 in the longitudinal direction are focused in a focus 4. In FIG. 1, the electromagnetic radiation paths are indicated by dashed lines including arrows. It is noted that examples of more detailed tubes in accordance with the disclosure are described below.

Figure 2B:
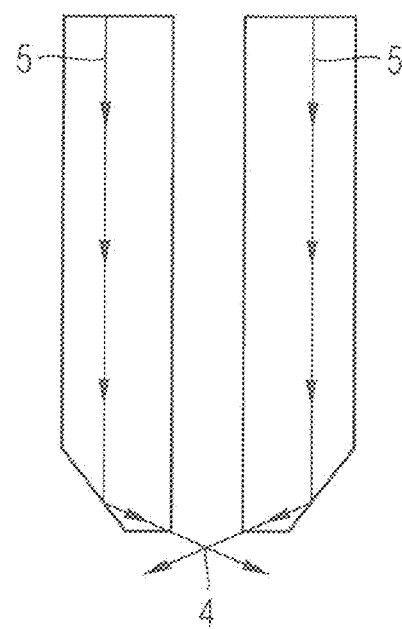

FIGS. 2A and 2B schematically illustrate a method for operating a device 200 in accordance with the disclosure. The device 200 may be similar to the device 100 of FIG. 1. In a first step (see FIG. 2A) a tube 1 is provided. The tube 1 is extending in a longitudinal direction, wherein the tube 1 includes a hollow channel 2 arranged in the tube 1. An end part 3 of the tube 1 is formed such that electromagnetic radiation paths extending in the tube 1 and outside of the hollow channel 2 in the longitudinal direction are focused in a focus 4. In FIG. 2A, the electromagnetic radiation paths are not explicitly illustrated and may be similar to the electromagnetic radiation paths of FIG. 1. In a second step (see FIG. 2B), electromagnetic radiation 5 is directed into the tube 1 such that the electromagnetic radiation 5 is focused in the focus 4. The electromagnetic radiation propagating along the paths is indicated by solid lines including arrows. It is noted that examples of more detailed methods in accordance with the disclosure are described below.

Figure 3:
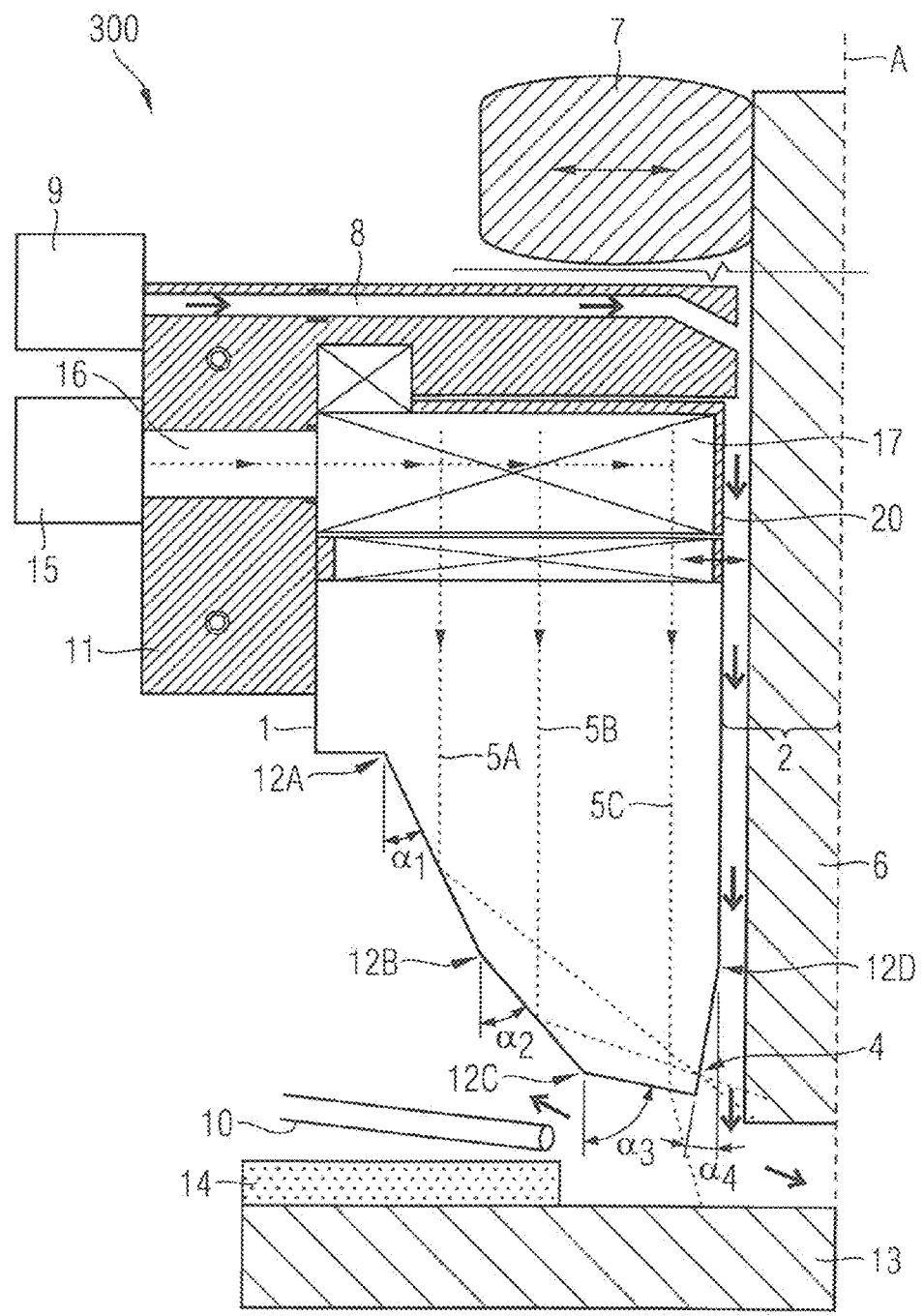
FIG. 3 schematically illustrates a cross-sectional view of a device 300 in accordance with the disclosure.

FIG. 3 schematically illustrates a cross-sectional view of a device 300 in accordance with the disclosure. The device 300 may be seen as an implementation of the device 100 such that details of the device 300 described below may be likewise applied to the device 100. For the sake of simplicity, only a left part of the device 300 is illustrated. The right part of the device 300 may be obtained by mirroring the left part on an axis A. An operation of the device 300 may be based on a method described in connection with FIGS. 4A to 4G in which the device 300 may be used as a wire bonder tool.

The device 300 may include a tube 1 which may extend in a longitudinal direction extending along the axis A. For example, the tube 1 may, e.g., have a rotational symmetry with respect to the axis A. A first hollow channel 2 may be arranged in the tube 1. The first hollow channel 2 may extend in the longitudinal direction and may connect an upper opening and a lower opening of the tube 1. The device 300 may be arranged over a first electrical contact element 13 and a passivation layer 14.

A wire 6 may be arranged in the first hollow channel 2 wherein the first hollow channel 2 is not necessarily completely filled with the wire 6 such that side parts of the first hollow channel 2 may remain hollow. The wire 6 may be fixed by means of a first clamp 7 that may be moved in a horizontal direction. A possible movement of the first clamp 7 in the horizontal direction is indicated by an horizontal arrow. In the exemplary scenario of FIG. 3, the first clamp 7 is closed such that the wire 6 is held in a fixed position. The first clamp 7 may be manufactured from an arbitrary material, for example a plastic material.

The first hollow channel 2 may be connected to a second hollow channel 8 that may, e.g., extend in a substantially horizontal direction. The second hollow channel 8 may be coupled to a forming gas unit 9 that may be configured to provide a forming gas such that during an operation of the device 300, a provided forming gas may run through the first hollow channel 2 and the second hollow channel 8. Note that a flow of the forming gas is indicated by arrows in the first hollow channel 2 and the second hollow channel 8. In addition, a forming gas may also be provided in the vicinity of the lower opening of the tube 1 by one or more nozzles or channels 10 that may be coupled to the forming gas unit 9 or a further forming gas unit (not illustrated).

The tube 1 may be held in a fixed position by a second clamp 11 that may be moved in a horizontal direction. After opening the second clamp 11, it is possible to remove the tube 1 and exchange it with a tube of different type.

An end part 3 of the tube 1 is formed such that electromagnetic radiation paths 5A, 5B, 5C may extend in the tube 1 and outside of the first hollow channel 2 in a manner described below. It is understood that there may be further (as matter of fact an infinite number of) electromagnetic radiation paths arranged between and beside the electromagnetic radiation paths 5A, 5B, 5C which are not illustrated for the sake of simplicity. For obtaining a desired course of the electromagnetic radiation paths 5A, 5B, 5C, the tube 1 may be beveled at one or more positions 12A, 12B, 12C, 12D wherein a respective bevel (or beveled edge) may be specified by a respective angle $\alpha_1, \alpha_2, \alpha_3, \alpha_4$. In particular, one or more of the angles $\alpha_1, \alpha_2, \alpha_3, \alpha_4$ may, e.g., be smaller than 40 degrees, more particular smaller than 35 degrees, and more particular smaller than 30 degrees. In particular, the reflection angles may depend on the material of the tube 1. It is noted that the illustrated geometric design of the tube 1 is of exemplary character. The tube 1 may be formed in various alternative ways in order to obtain the illustrated course of the electromagnetic radiation paths 5A, 5B, 5C.

The first electromagnetic radiation path 5A may extend inside the tube 1 and outside of the first hollow channel 2 in the longitudinal direction. The first electromagnetic radiation path 5A may be reflected at an inner wall of the tube 1 and may be directed in a direction towards the first hollow channel 2. In particular, the reflection of the first electromagnetic radiation path 5A may be total, i.e., electromagnetic radiation propagating along the first electromagnetic radiation path 5A may be reflected loss-free at the inner wall of the tube 1 by almost one hundred percent. In a similar fashion, the second electromagnetic radiation path 5B may extend inside the tube 1 and outside of the first hollow channel 2. It may be reflected at an inner wall of the tube 1 and may be directed towards the first hollow channel 2. The first electromagnetic radiation path 5A and the second electromagnetic radiation path 5B may be focused in a focus 4.

As will be described more detailed below, laser light propagating along the electromagnetic radiation paths 5A, 5B and focused in the focus 4 may be used to melt the wire 6. In this connection, it is understood that the position of the focus 4 is not required to exactly coincide with a position of the wire 6. It may also be possible to locate the focus 4 adjacent to the wire 6. It is understood that the electromagnetic radiation is not exclusively bundled in the focus 4. Rather, the electromagnetic radiation propagating along the electromagnetic radiation paths 5A, 5B, 5C and also along electromagnetic radiation paths arranged in between is bundled in an extended area. The focus 4 is thus rather meant to illustrate the convergence of the electromagnetic radiation. The area in which the electromagnetic radiation is bundled shows an increased energy density compared to the unfocused electromagnetic radiation. In another example, a position of the focus 4 may coincide with a position of the wire 6. It is noted that electromagnetic radiation paths extending through the right part of the tube 1 (not illustrated) may be focused in a focus as well.

The third electromagnetic radiation path 5C may extend inside the tube 1 and outside of the first hollow channel 2 in the longitudinal direction. The third electromagnetic radiation path 5C may be refracted at an optical active wall of the tube 1 and may be directed in a direction towards the axis A. The third electromagnetic radiation path 5C and corresponding paths extending through the right part of the tube 1 (not illustrated) may be focused in a further focus. In FIG. 3, such further focus is not explicitly illustrated, but it may be constructed by prolonging the third electromagnetic radiation path 5C and its counterpart extending through the right part of the tube 1 until an intersection is obtained. As will be explained later, laser light propagating along the third electromagnetic radiation path 5C may be used to condition, clean, heat up and/or melt the first electrical contact element 13. It is understood that the further focus is not necessarily exactly arranged at a position of the electrical contact element 13, but may be shifted in a vertical and/or horizontal direction.

It is noted that the bevel at the position 12D may not necessarily have an influence on the course of the electromagnetic radiation paths 5A, 5B, 5C. Due to the bevel at the position 12D a diameter of the first hollow channel 2 may be increased at the end part 3 of the tube 1. Such increased diameter may be helpful when an end part of the wire 6 is melted, thereby increasing its vertical dimensions and thus its volume compared to a solid state of the wire 6.

The device 300 may include a laser source 15 (or more general a source for electromagnetic radiation) that may be coupled to the tube 1 via an interface 16. In addition, the device 300 may include an optical unit 17 configured to change a direction of laser light provided by the laser source 15. During an operation of the device 300, laser light may be emitted by the laser source 15 and may propagate through the interface 16 to the optical unit 17. The optical unit 17 may redirect the laser light such that the light follows the electromagnetic radiation paths 5A, 5B and 5C as described. For example, the optical unit 17 may reflect the laser light by an angle of 90 degrees such that laser light emitted by the laser source 15 in an horizontal direction may be redirected in the longitudinal direction.

The device 300 may include a circular orifice (or annular orifice) 20, a possible movement of which is indicated by an arrow. By moving the circular orifice 20 in an horizontal direction, one or more laser rays propagate along the electromagnetic radiation paths 5A, 5B and 5C may be masked out. In FIG. 3, the circular orifice 20 is in its most right position such that laser light emitted by the laser source 15 may propagate along all electromagnetic radiation paths 5A, 5B, 5C. For example, the circular orifice 20 may be moved to the left to a first position such that laser light following the third electromagnetic radiation path 5C may be masked out. In this case, a focusing of laser light on the first electrical contact element 13 may be avoided.

The circular orifice 20 may be moved even further to the left to a second position such that the second electromagnetic radiation path 5B and the third electromagnetic radiation path 5C may be masked out, i.e., no laser light will propagate along the electromagnetic radiation paths 5B and 5C. In this case, the laser beam is not focused on the first electrical contact element 13. In addition, the amount of laser light focused in the focus 4 may be reduced. Note that in the described second position of the circular orifice 20, laser light may still be focused in the focus 4 by propagating along the first electromagnetic radiation path 5A.

The circular orifice 20 may be moved even further to the left in a third position such that laser light propagating along the first electromagnetic radiation path 5A, the second electromagnetic radiation path 5B and the third electromagnetic radiation path 5C may be masked out. It is noted that the circular office may generally be configured to mask out any desired combination of electromagnetic radiation paths such that any desired distribution of light rays passing the tube 1 may be achieved. For example, it may also be possible that only the first electromagnetic radiation path 5A or only the second electromagnetic radiation path 5B are masked out. In another example, the first electromagnetic radiation path 5A and the second electromagnetic radiation path 5B may be masked out such that only light following the third electromagnetic radiation path 5C may be left. By masking out a desired combination of electromagnetic radiation paths, an amount of energy applied to the bond wire 6 and the first electrical contact element 13 may be controlled.

A positioning of the circular orifice 20 may be accomplished by any suitable technique, for example by employing an electromechanical device. Alternatively, the circular orifice 20 may be used in a fixed position such that a dedicated tube may be useable for different applications. Adjusting a position of the circular orifice 20 may, e.g., be achieved during a time interval from about 0.1 milliseconds to about 10 milliseconds. It is noted that a desired choice (or masking out) of electromagnetic radiation paths may not only be accomplished by choosing a corresponding position of the circular orifice 20. It may also be possible to exchange the tube 1 by a tube of different shape. If, for example, light propagating along the first electromagnetic radiation path 5A shall be masked out, the circular orifice 20 may be adjusted accordingly. Alternatively, a narrower tube may be used in which the part of the tube 1 including the first electromagnetic radiation path 5A is left out. Such narrower tube may have a reduced thickness and may be held in a fixed position by shifting the second clamp 11 to the right.

The device 300 may, e.g., be used for a scenario in which the wire 6 and/or the first electrical contact element 13 shall be melted such that an electrical connection between these two components may be provided. Depending on the material of the wire 6, the size of the wire 6, the material of the first electrical contact element 13, the size of the first electrical contact element 13, etc., a specific operation mode of the device 300 may be chosen. For example, a wavelength of the laser light emitted by the laser source 15, the shape and size of the tube 1, the position of the circular orifice 20, etc., may be chosen depending on the respective scenario.

FIGS. 4A to 4G schematically illustrate a cross-sectional view of a method for operating a device 400 in accordance with the disclosure. The device 400 may be similar to any of the devices 100 to 300 such that details of the devices 100 to 300 described above may be likewise applied to the device 400 and vice versa. In addition, the method shown in FIGS. 4A to 4G may be seen as an implementation of the method illustrated in FIGS. 2A and 2B. Details of the manufacturing method that are described below may therefore be likewise applied to the method of FIGS. 2A and 2B.

Figure 4A:
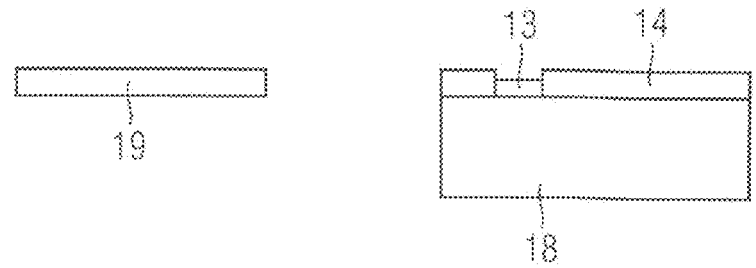

In FIG. 4A, an electrical device 18 including a first electrical contact element 13 and a passivation layer 14 may be provided. For example, the electrical device 18 may be a semiconductor chip of arbitrary type. It is noted that the described method is not restricted to a specific type of the electrical device 18. The first electrical contact element 13 may also be of arbitrary type, for example an electrical contact pad that may be electronically coupled to an electronic structure of the electrical device 18. In addition, a second electrical contact element 19 may be provided. The second electrical contact element 19 may be of arbitrary type, for example an electrical contact element of a Printed Circuit Board (PCB), a pin of a leadframe or a pad of a further semiconductor chip. As will be described in the following, an electrical connection between the first electrical contact element 13 and the second electrical contact element 19 shall be provided via a bond wire. Such electrical connection may establish a connection between a microscopic electronic structure of the electrical device 18 and a macroscopic external component (not illustrated) that may be connected to the second electrical contact element 19.

Figure 4B:
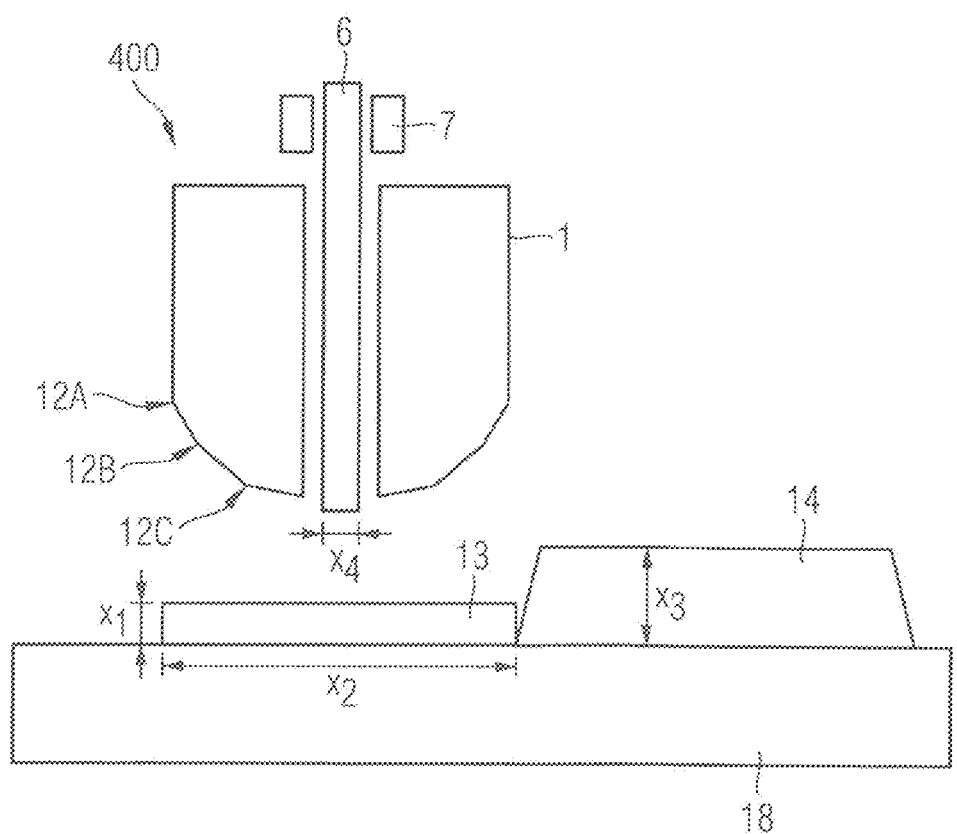

In FIG. 4B, the first electrical contact element 13, the passivation layer 14 and the electrical device 18 are illustrated in a larger scale as compared to FIG. 4A. For the sake of simplicity the second electrical contact element 19 is not shown. As can be seen from FIG. 4B, a height $x_1$ of the first electrical contact element 13 may be in a range from about 5 μm (micrometers) to about 20 μm (micrometers). In addition, a lateral extension $x_2$ of the first electrical contact element 13 may be in a range from about 70 μm (micrometers) to about 100 μm (micrometers) for an exemplary case of a bond wire that is to be coupled to the electrical contact element 13, the bond wire having a thickness of about 50 μm (micrometers). In another example, such bond wire may have a thickness of about 25 μm (micrometers) such that a lateral extension $x_2$ of the first electrical contact element 13 may be in a range from about 35 μm (micrometers) to about 60 μm (micrometers). For example, the first electrical contact element 13 may have a circular shape such that the lateral extension may correspond to a diameter of the first electrical contact element 13. A height $x_3$ of the passivation layer 14 may be up to about 30 μm (micrometers).

A tube 1 is provided over the first electrical contact element 13. The tube 1 may be similar to one of the tubes described in connection with FIGS. 1 to 3 such that similar reference signs may refer to similar components. All comments made in connection with previous figures may also hold true for FIGS. 4A to 4G. The tube 1 of FIG. 4B may be beveled at positions 12A, 12B and 12C similar to FIG. 3. A bond wire 6 may be inserted into a hollow channel 2 of the tube 1. The bond wire 6 may be arranged within a clamp 7 that is opened in the scenario of FIG. 4B. A thickness $x_4$ of the bond wire 6 may be in a range from about 15 μm (micrometers) to about 70 μm (micrometers). An electrical connection between the bond wire 6 and the first electrical contact element 13 is to be provided.

In FIG. 4C, the bond wire 6 may be held in a fixed position by the clamp 7 such that a movement of the bond wire 6 in a vertical direction may be avoided. A laser beam (or more general electromagnetic radiation) may be directed into the tube 1, for example by using respective components described in connection with FIG. 3. A propagation of the laser light through the tube 1 may be represented by first electromagnetic radiation paths 5A, second electromagnetic radiation paths 5B and third electromagnetic radiation paths 5C. Note that, in FIG. 4C, the electromagnetic radiation paths 5A, 5B, 5C are arranged on the both sides of the tube 1 in contrast to FIG. 3 where only the left part of the tube 1 has been illustrated for the sake of simplicity. It is understood that the electromagnetic radiation paths of the light are not restricted to the plane illustrated in the cross-sectional view of FIG. 4C, but may represent a three-dimensional distribution of light (or more general electromagnetic radiation). An exemplary three-dimensional distribution of light may be obtained by rotating the cross section of FIG. 4C around an axis that may be defined by the hollow channel 2.

Laser light propagating along the first electromagnetic radiation paths 5A may be reflected up to almost one hundred percent at an inner wall of the tube 1 and thereby may be directed towards the bond wire 6. In particular, the laser light may be directed towards a first focus 4A located on a lower end of the bond wire 6. In a similar fashion, laser light extending along the second electromagnetic radiation paths 5B may be reflected up to almost one hundred percent at an inner wall of the tube 1 and thereby may be directed towards the bond wire 6 and the first focus 4A. The first focus 4A may be substantially arranged on an axis that may be defined by the hollow channel 2. However, it is noted that the first focus 4A may also be shifted in an arbitrary direction to be arranged in a vicinity of the bond wire 6, but not exactly on a position of the bond wire 6. In both cases, the energy of the focused laser beam may be sufficient to provide a melting of the bond wire 6.

Laser light propagating along the third electromagnetic radiation paths 5C may be refracted at an inner wall of the tube 1 and directed in a direction towards an axis that may be defined by the bond wire 6. The laser light extending along the third electromagnetic radiation paths 5C may be focused in a second focus 4B that may be located on the axis defined by the bond wire 6 and on the first electrical contact element 13. It is noted that the second focus 4B may also be slightly shifted in a vertical and/or horizontal direction such that it may not necessarily be exactly located on the axis and/or the first electrical contact element 13. In both cases, the energy of the laser beam may be sufficient to provide a melting, or at least a conditioning, of the first electrical contact element 13.

A desired distance between the tube 1 and the first electrical contact element 13 may be adjusted by any appropriate technique, for example by employing a laser sensor. Such laser sensor may be configured to measure a distance between the tube 1 and the first electrical contact element 13. When the measured distance deviates from the desired distance, a position of the tube 1 may be adjusted.

As described, laser light may be focused in the first focus 4A such that an end part of the bond wire 6 may be melted. The molten wire material may have the shape of a sphere (or a ball or a drop) having a diameter (or a thickness) that may be greater than the thickness of the solid wire bond 6 before the melting process. The volume of the molten ball at the end of the bond wire 6 may be controlled by choosing a time interval during which the laser beam is active. In general, the volume of the molten part of the bond wire 6 may be increased by increasing time interval of activation. In particular, the laser beam may be active during a predefined time interval which may have a length of about some milliseconds, depending on the chosen laser energy. For example, the bond wire 6 may have a thickness of about 25 μm (micrometers) and the time interval may be chosen such that a diameter of the molten ball may lie in a range from about 25 μm (micrometers) to about 30 μm (micrometers). This way, a diameter of the first electrical contact element 13 is not necessarily required to be greater than about 30 μm (micrometers).

In addition, the laser light may be focused in the second focus 4B such that the first electrical contact element 13 which may be arranged in or near the second focus 4B may be conditioned or even melted. Alternatively, a heat radiation emitted by the melted bond wire 6 may suffice to at least partly melt the first electrical contact element 13 such that focusing the laser beam in the second focus 4B may be omitted or reduced. Such treatment of the electrical contact pad 13 may condition the electrical contact pad 13, thereby improving a bondability to the wire.

A forming gas may be directed through the hollow channel 2 (see arrows). For example, the forming gas may be provided as described in connection with FIG. 3. Applying the forming gas may reduce an oxidation of the bond wire 6 material and/or an oxidation of the first electrical contact element 13 material that may occur during executing the described method. In addition, an application of the forming gas may cool the tube 1 and prevent a heat damage of the tube 1. Moreover, applying the forming gas may avoid a contact between molten material of the bond wire 6 and an inner wall of the hollow channel 2. Further, applying the forming gas may avoid that an inner wall of the hollow channel 2 may steam up and/or be deposited with a metal material.

Figure 4D:
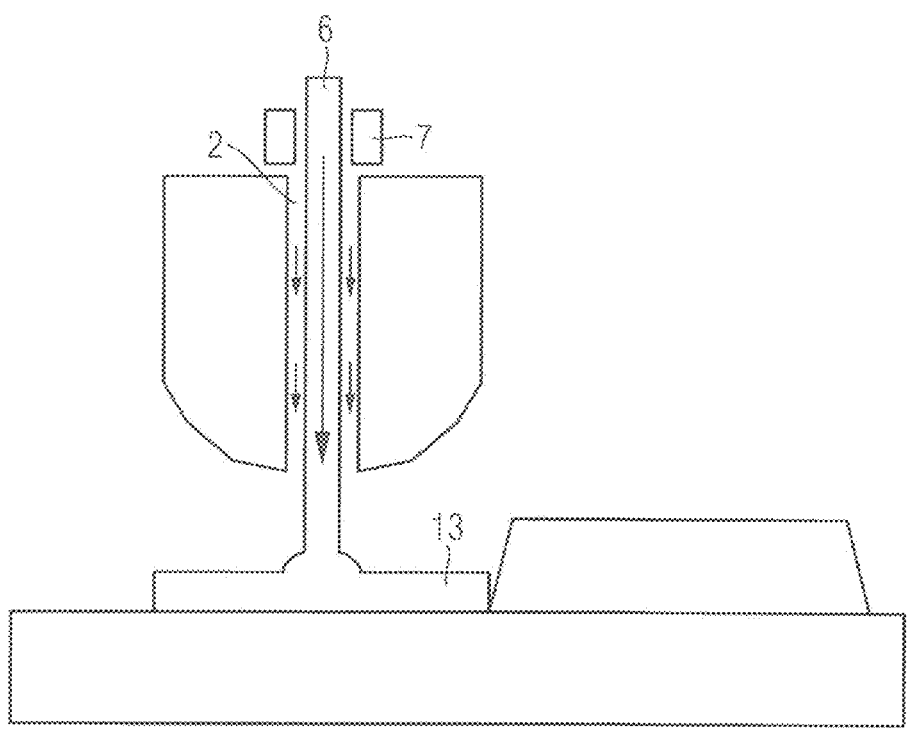

In FIG. 4D, the laser beam may be deactivated at a time when the end part of the bond wire 6 and (optionally) the first electrical contact element 13 are molten such that a connection between these components may be established. The clamp 7 may be opened such that the bond wire 6 including its molten end part may be moved towards the first electrical contact element 13 (see arrow in the bond wire 6). For example, a pressure of the forming gas directed through the hollow channel 2 may be strong enough to move the bond wire 6 in towards the first electrical contact element 13. Alternatively or additionally, the bond wire 6 may be moved towards the first electrical contact element 13 by any other suitable technique, for example by means of a piezoelectric motor. The end part of the bond wire 6 and the first electrical contact element 13 may contact each other such that the molten materials of the bond wire 6 and the first electrical contact element 13 may at least partly mix with each other.

It is noted that impurities may be located on a surface of the bond wire 6 and/or on a surface of the first electrical contact element 13. For example, such contaminations may include condensed material from the ambiance, organic materials from pre-processes, metal oxide layers, corrosion products, etc. By exposing the bondable materials to the electromagnetic energy and melting the bond wire 6 and/or the first electrical contact element 13, the contaminations may be partly or fully evaporated. Remaining contaminations may be melted such that a slag may be formed on the bond wire 6 and/or on the first electrical contact element 13. By pressing the molten bond wire 6 against the molten first electrical contact element 13, the slag may be broken through such that a continuous connection of molten material may be provided between the bond wire 6 and the first electrical contact element 13.

When the laser beam has been deactivated, no further energy is provided to the bond wire 6 and/or the first electrical contact element 13. Hence, the molten material providing a contact between the bond wire 6 and the first electrical contact element 13 may cool down. For example, heat may be dissipated away from the first electrical contact element 13 through the bond wire 6. In addition, heat may be dissipated away from the first electrical contact element 13 and the bond wire 6 by convection via the forming gas. By cooling down the molten material that is formed by the molten material of the bond wire 6 and the molten material of the first electrical contact element 13 under a solidification temperature of the material, a solidification structure may be formed. For example, by cooling down below the solidification temperature a polycrystalline structure may start to grow providing a continuous transition between the materials of the bond wire 6 and the first electrical contact element 13. It is noted that a detailed specification of the continuous transition between the bond wire 6 and the electrical contact element 13 after cooling down the molten material is provided in connection with FIG. 6.

Figure 4E:
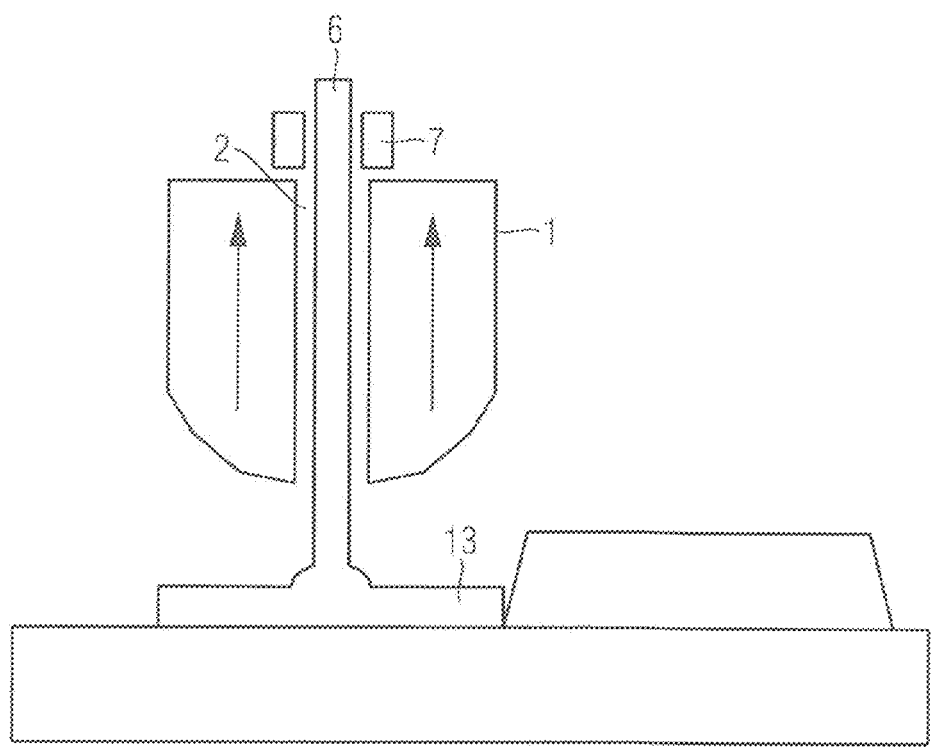

In FIG. 4E, the clamp 7 may be opened (or may remain opened) and the tube 1 may be lead away from the first electrical contact element 13 (see arrows in the tube 1). In particular, the tube 1 may be pulled to the second electrical contact element 19 described in connection with FIG. 4A. It is noted that the bond wire 6 may remain within the hollow channel 2 while the tube 1 and the wire bond 6 included therein may be pulled to the second electrical contact element 19. The provision of the forming gas may be stopped during the method step of FIG. 4E.

Figure 4F:
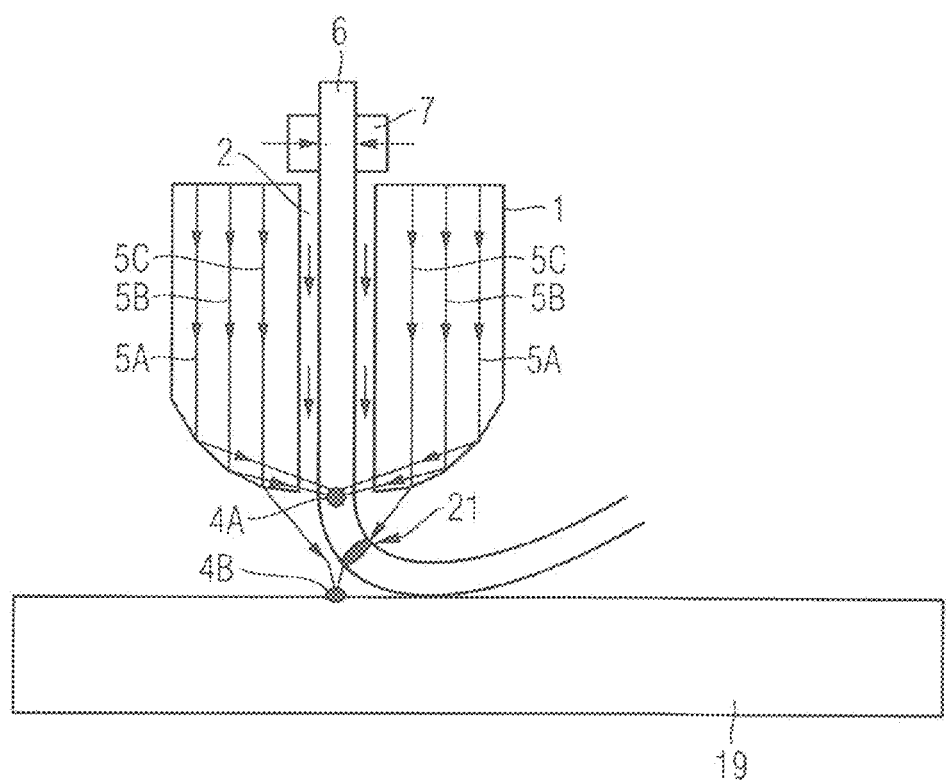

In FIG. 4F, the tube 1 may be arranged over the second electrical contact element 19 such that an electrical connection between the bond wire 6 and the second electrical contact element 19 may be provided. When an appropriate position of the tube 1 has been reached, the clamp 7 may be closed such that a movement of the bond wire 6 in a vertical direction may be avoided. Similar to FIG. 4C, a laser beam may be directed into the tube 1 and may propagate along the electromagnetic radiation paths 5A, 5B, 5C. The laser beam may be focused in a first focus 4A and a second focus 4B as previously described.

The laser beam may again propagate along the first electromagnetic radiation paths 5A and the second electromagnetic radiation paths 5B and may be focused in the first focus 4A. The bond wire 6 arranged in the hollow channel 2 may be melted at (or near) the first focus 4A. A melting of the bond wire 6 at (or near) the first focus 4A may result in a breaking of the bond wire 6. In addition, the laser beam may be focused in the second focus 4B such that the second electrical contact element 19 may be melted at its surface. Since the second electrical contact element 19 may be bigger or more massive than the first electrical contact element 13, the power of the laser beam may be increased compared to the method step described in connection with FIG. 4C. It is noted that the bond wire 6 may also be melted at a further position 21 at which the bond wire 6 may cross the laser light extending along the third electromagnetic radiation paths 5C. The melting of the wire bond 6 at (or near) the position 21 may also result in a breaking of the bond wire 6.

The melted bond wire 6 and the melted second electrical contact element 19 may be brought in contact with each other. When a connection between the bond wire 6 and the second electrical contact element 19 is established (or before when at least the bond wire 6 is melted), the laser beam may be deactivated. After deactivating the laser beam, the molten material of the bond wire 6 and the second electrical contact element 19 may cool down. For example, heat may be dissipated away from the second electrical contact element 19 through the bond wire 6. In addition, heat may also be dissipated away from the second electrical contact element 19 and the bond wire 6 by convection via the forming gas that may have been activated again. By cooling down the molten material formed by the molten material of the bond wire 6 and the molten material of the second electrical contact element 19 under a solidification temperature of the material, a solidification structure may be formed. For example, by cooling down below the solidification temperature a polycrystalline structure may start to grow providing a continuous transition between the materials of the bond wire 6 and the second electrical contact element 19. A transition between the bond wire 6 and the second electrical contact element 19 may be similar to the transition between the bond wire 6 and the first electrical contact element 13.

Figure 4G:
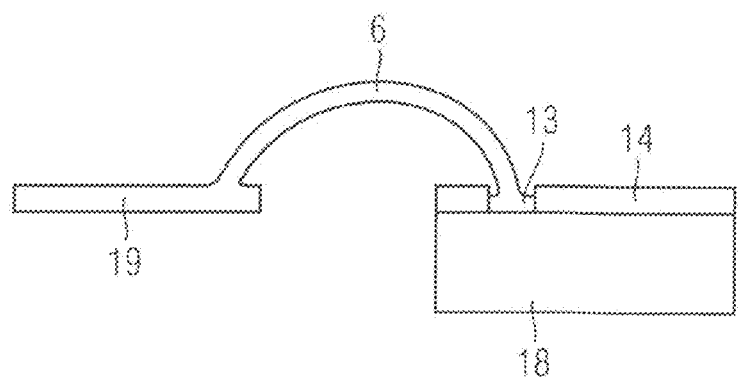

In FIG. 4G, an electrical connection between the first electrical contact element 13 and the second electrical contact element 19 via the bond wire 6 is established. Comments made in connection with FIG. 4A may also hold true for FIG. 4G.

Using a device or a method in accordance with the disclosure in order to establish an electrical connection may be advantageous compared to an employment of other devices or methods for providing a similar electrical connection. Exemplary advantages are described in the following.

No additional protection layers, e.g., to prevent oxidation, may be required on the semiconductor material and/or the electrical contact elements.

Devices in accordance with the disclosure may be used for providing electrical connections between components of different types. The devices may be adjusted to the respective scenario in a simple and quick way, for example by a simple exchange of the present tube with a more suitable tube.

During performing a method in accordance with the disclosure, mechanical stress applied to the electrical contact elements and the tube may be reduced compared to, e.g., ultrasound wire bonding techniques. Mechanical protective layers, e.g., pad reinforcement layers, may be unnecessary.

Using a method in accordance with the disclosure, the volume and the spherical dimensions of the melted end of the bond wire may be controlled in an effective manner and may be reduced in comparison to other techniques. As a consequence, a surface area of the electrical contact elements may thus be reduced.

Figure 5:
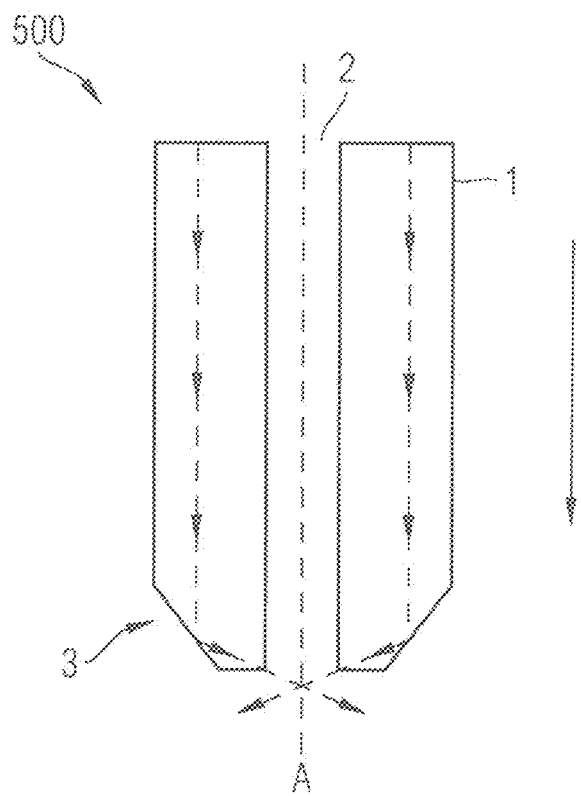
FIG. 5 schematically illustrates a cross-sectional view of a device 500 in accordance with the disclosure.

FIG. 5 schematically illustrates a cross-sectional view of a device 500 in accordance with the disclosure. The device 500 includes a capillary 1 extending in a longitudinal direction (see arrow) wherein an end part 3 of the capillary 1 is beveled. The device 500 further includes a hollow channel 2 arranged in the capillary 1 and defining an axis A. In FIG. 5, the hollow channel 2 is arranged in the longitudinal direction. It is noted that in other examples the hollow channel 2 may have a different spatial orientation. At the beveled end part 3 of the capillary 1, electromagnetic radiation paths extending in the capillary 1 and outside of the hollow channel 2 in the longitudinal direction are directed towards the axis A.

It is understood that the device 500 may include further components, for example components described in connection with FIG. 3. Comments made in connection with previous figures may thus also hold true for FIG. 5.

Figure 6:
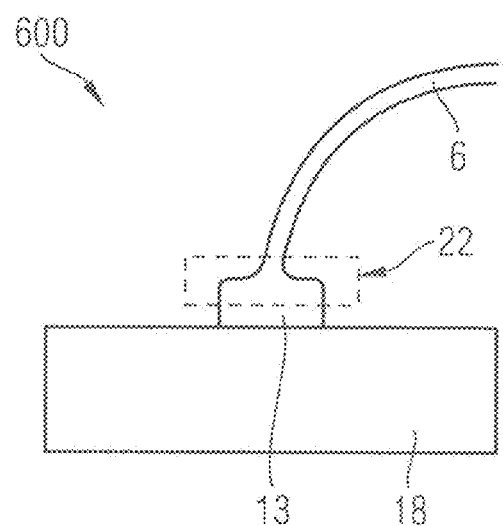
FIG. 6 schematically illustrates a cross-sectional view of a device 600 in accordance with the disclosure.

FIG. 6 schematically illustrates a cross-sectional view of a device 600 in accordance with the disclosure. The device 600 includes a semiconductor material 18, an electrical contact element 13 and a bond wire 6. The electrical contact element 13 includes a first material and is arranged over the semiconductor material 18. The bond wire 6 includes a second material and is electrically coupled to the electrical contact element 13. A transition 22 (see dashed square) between the first material and the second material is continuous. It is noted that an electrical coupling between the bond wire 6 and the electrical contact element 13 may particularly have been established according to one of the previously described methods.

The term "continuous" shall indicate that there is not necessarily a sharp transition between the first material of the electrical contact element 13 and the second material of the bond wire 6. For example, instead of applying a method in accordance with the disclosure, a connection between the bond wire 6 and the electrical contact element 13 may be established by applying an ultrasonic wire bonding technique. In this case, an interface surface between the first material of the electrical contact element 13 and the second material of the bond wire 6 may occur which may represent a sharp transition between these two materials. Such interface surface resulting from an application of an ultrasonic wire bonding technique may extend over the whole cross section of the transition between the bond wire 6 and the electrical contact element 13.

By applying a method in accordance with the disclosure, such sharp interface surface may be avoided. Rather, a continuous transition between the first material of the electrical contact element 13 and the second material of the bond wire 6 may be obtained. For example, the first material and the second material may be made of a similar material having, e.g., a polycrystalline structure. Here, after having established a connection in accordance with the disclosure, it may be impossible to determine an actual transition between the first and second material. Rather, a transition between the first material and the second material may be represented by a homogeneous polycrystalline material structure.

Each of the first material of the electrical contact element 13 and the second material of the bond wire 6 may be made of or may include at least one of a metal and a metal alloy. In particular, each of the first material of the electrical contact element 13 and the second material of the bond wire 6 may be made of or may include copper. Each of the first material of the electrical contact element 13 and the second material of the bond wire 6 may be made of or may include a polycrystalline structure.

The device 600 may include a second electrical contact element (not illustrated). The second electrical contact element may, e.g., be part of a printed circuit board or a leadframe and may, e.g., correspond to the second electrical contact element 19 of FIG. 4A. The second electrical contact element may include a third material, wherein the bond wire 6 may be coupled to the second electrical contact element. A transition between the first material and the third material may be continuous.

The bond wire 6 and the electrical contact element 13 may have a dimension as already specified in connection with previous figures. A contact area between the electrical contact element 13 and the bond wire 6 may fulfill at least one of the following conditions: (1) the contact area may include a diameter of less than about double the wire thickness (or diameter), and (2) as the method is contact free, a shaping or imprint caused by a capillary form at the bond wire 6, at the electrical contact element 13 and/or at the contact area may be avoided.

FIGS. 7A to 7C schematically illustrate a method for providing an electrical connection in accordance with the disclosure. Comments made in connection with foregoing figures may also hold true in connection with the method of FIGS. 7A to 7C.

In FIG. 7A, a bonding wire 6 and an electrical contact pad 13 are provided. In addition, electromagnetic radiation 23A is provided which may be focused onto the bonding wire 6, and electromagnetic radiation 23B is provided which may be focused onto the electrical contact pad 13. For example, a device similar to one of the devices described in connection with FIGS. 1, 3, 5 may be employed to provide the electromagnetic radiation 23A, 23B.

In FIG. 7B, the electromagnetic radiation 23A has caused a partly melting of the bonding wire 6 in an area 24 at a free end of the bonding wire 6. In addition, the electromagnetic radiation 23B has caused a heating of the electrical contact pad 13 which may particularly result in a conditioning of the electrical contact pad 13. In this connection, the term conditioning may mean cleaning, surface activation or partly melting an area 25 of the surface of the electrical contact pad 13.

In FIG. 7C, the conditioned and partly melted bonding wire 6 and electrical contact pad 13 are brought in contact such that an electrical connection between the bonding wire 6 and the electrical contact pad 13 may be provided. It is noted that this procedure may be performed in such a way that there may be no or only a very low force that is applied. Due to a subsequent cooling down of a contact zone 26, a solidification of the contact area occurs. For example, this may result in a structure as described in connection with FIG. 6.

While a particular feature or aspect of the disclosure may have been specified with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein. Therefore, it is intended that this invention be limited only by the claims and the equivalents thereof.

What is claimed is:

1. A device, comprising:
a tube extending in a longitudinal direction; and
a hollow channel arranged in the tube,
wherein an end part of the tube is formed such that first electromagnetic radiation paths extending in the tube and outside of the hollow channel in the longitudinal direction are focused in a first focus.

2. The device of claim 1, wherein the hollow channel extends in the longitudinal direction.

3. The device of claim 1, wherein the hollow channel defines an axis extending in the longitudinal direction and the first focus is substantially arranged on the axis.

4. The device of claim 1, wherein the first electromagnetic radiation paths comprise a reflection at the end part of the tube or a refraction at the end part of the tube.

5. The device of claim 1, wherein
second electromagnetic radiation paths extending in the tube and outside of the hollow channel in the longitudinal direction are focused in a second focus,
the first electromagnetic radiation paths comprise a reflection at the end part of the tube, and
the second electromagnetic radiation paths comprise a refraction at the end part of the tube.

6. The device of claim 1, wherein the tube comprises a material selected from the group consisting of a quartz material, ZnS, GaAs and sapphire.

7. The device of claim 1, wherein a thickness of the hollow channel is between 15 and 1000 micrometers.

8. The device of claim 1, further comprising an interface configured to couple the tube to a laser source.

9. The device of claim 1, further comprising a unit configured to provide a forming gas.

10. The device of claim 1, wherein the device comprises a wire bonder tool.

11. A device, comprising:
a capillary extending in a longitudinal direction, wherein an end part of the capillary is beveled; and
a hollow channel arranged in the capillary and defining an axis,
wherein at the beveled end part of the capillary electromagnetic radiation paths extending in the capillary and outside of the hollow channel in the longitudinal direction are directed towards the axis.

12. The device of claim 11, wherein the electromagnetic radiation paths are directed towards a focus by at least one of a reflection and a refraction.

13. A device, comprising:
a semiconductor material;
an electrical contact element comprising a first material and arranged on the semiconductor material; and
a bond wire comprising a second material and electrically coupled to the electrical contact element, wherein a transition between the first material and the second material is a continuous homogeneous polycrystalline material structure which is free of an interface surface between the first material and the second material.

14. The device of claim 13, wherein each of the first material and the second material comprises a metal or a metal alloy.

15. The device of claim 13, wherein the first material and the second material both comprise copper.

16. The device of claim 13, wherein the transition comprises a solidification structure.

17. The device of claim 13, further comprising a further electrical contact element of a printed circuit board or a leadframe and comprising a third material, wherein the bond wire is electrically coupled to the further electrical contact element and a transition between the first material and the third material is continuous.

18. A device, comprising:
a semiconductor material;
an electrical contact element comprising a first material and arranged on the semiconductor material;
a bond wire comprising a second material and electrically coupled to the electrical contact element, wherein a transition between the first material and the second material is continuous; and
an electrical contact element of a printed circuit board or a leadframe and comprising a third material, wherein the bond wire is electrically coupled to the electrical contact element of the printed circuit board and a transition between the first material and the third material is continuous.

* * * * *